United States Patent
Einaga et al.

(10) Patent No.: US 6,567,310 B2
(45) Date of Patent: May 20, 2003

(54) NONVOLATILE SEMICONDUCTOR MEMORY WITH IMPROVED SENSE AMPLIFIER OPERATING MARGIN

(75) Inventors: Yuichi Einaga, Kawasaki (JP); Yasushi Kasa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/102,660

(22) Filed: Mar. 22, 2002

(65) Prior Publication Data

US 2002/0145906 A1 Oct. 10, 2002

(30) Foreign Application Priority Data

Oct. 4, 2001 (JP) .......................................... 2001-308399

(51) Int. Cl.$^7$ ............................................... G11C 16/00
(52) U.S. Cl. ............................... 365/185.2; 365/185.23; 365/194; 365/233.5
(58) Field of Search .................. 365/185.2, 185.23, 365/185.21, 194, 210, 233.5

(56) References Cited

U.S. PATENT DOCUMENTS 6,191,979 B1 * 2/2001 Vekubo .................... 365/185.2
6,208,564 B1 * 3/2001 Yamada et al. .......... 365/185.2
6,339,556 B1 * 1/2002 Watanabe ................ 365/185.2

* cited by examiner

Primary Examiner—Tan T. Nguyen
(74) Attorney, Agent, or Firm—Arent Fox Kintner Plotkin & Kahn, PLLC

(57) ABSTRACT

Nonvolatile semiconductor memory has a core-side cell array having word lines, bit lines and memory cells; a reference-side cell array having word lines, bit line, and reference cell; and, a sense amplifier which compares a core-side input voltage corresponding to a bit line current in the core-side cell array, and a reference-side input voltage corresponding to the bit-line current in the reference-side cell array. The core-side decoder-driver and reference-side decoder-driver drive the core-side and reference-side word lines to the power supply voltage at a first time at the end of the address change detection pulse, and, at a second time a prescribed time after the end of the address change detection pulse, drive the core-side and reference-side word lines to a boost voltage level higher than the power supply voltage. The sense amplifier begins comparison of the core-side and the reference-side input voltages after the second time.

13 Claims, 18 Drawing Sheets

NONVOLATILE SEMICONDUCTOR MEMORY WITH IMPROVED SENSE AMPLIFIER OPERATING MARGIN

BACKGROUND OF THE INVENTION

1. Field of the Invention

This invention relates to a nonvolatile semiconductor memory, and in particular to a nonvolatile semiconductor memory in which a method of driving core-side word lines and reference-side word lines is improved, to improve the sense amplifier operating margin.

2. Description of the Related Art

Flash memory is in widespread use as nonvolatile semiconductor memory. Memory cells comprise a cell transistor having a floating gate, and the fact that the threshold voltage of the cell transistor differs according to the amount of charge stored in the floating gate is utilized to perform data reading. That is, an amount of charge corresponding to the data is injected into the floating gate during programming, and this state is maintained. This state is maintained even if the power supply is turned off.

In readout, stored data is read by applying a prescribed read voltage to the control gate and detecting the drain current of the cell transistor. The threshold voltage of the cell transistor varies according to the amount of charge, and therefore the drain current of the cell transistor also differs according to the amount of charge. Accordingly, by detecting the value of the drain current, stored data can be read. More specifically, as described below, the drain current of the cell transistor is current-voltage converted, and the voltage value is detected by the sense amplifier.

Differences in the drain currents of cell transistors are minute, and so normally a reference level, obtained by current-voltage conversion of the drain current of a reference-side cell transistor, is compared with the core-side level. Here it is desirable that the sense amplifier which compares the two levels has a large operating margin.

FIG. 1 is a figure of the configuration of conventional nonvolatile memory; FIG. 2 is a timing chart of its operation. Nonvolatile memory has a core-side memory cell array C-MCA which stores data, and a reference-side memory cell array R-MCA having comparison cells which are selected during read and verify processes.

The external address E-Add is supplied to the address buffer and ATD circuit 10; when a change occurs in the external address at time t0, a detection signal ATD is generated. In response to this, a timing control circuit 12 generates a voltage-boost signal KICK, sense amplifier control signals EQ and LT, and other signals at a prescribed timing after time t1. The address buffer 10 supplies the pre-decoded X address X-Add to the X decoder 14, and the Y address Y-add to the Y decoder 16. Hence after the address change detection signal ATD has risen, the X decoder 14 operates to select the core-side word line C-WL and drive it to the power supply voltage Vcc.

When the core-side word line C-WL rises, the drain current of the cell MC flows at the core-side bit line C-BL, and the bit line current selected by the Y decoder 16 is supplied to the core-side cascode circuit 18. The cascode circuit 18 converts the bit line current into the voltage SAI, which is supplied to the sense amplifier 26.

The reference-side decoder 20 responds to the control signal KICK, selects the reference cell R-MC for reading, and passes a drain current for reference through the bit line R-BL. This bit line current is converted into a voltage by the reference-side cascode circuit 24, and the voltage SAREF is supplied to the sense amplifier 26.

In reading, the word lines C-WL and R-WL must be raised to a boost voltage Vbb which is higher than the power supply voltage Vcc. Hence the voltage-boost circuit 28 responds to the voltage-boost signal KICK occurring at time t1, and supplies the boost voltage Vbb to the word drivers of the decoders 14, 20, and puts both the word lines C-WL, R-WL at the boost voltage level Vbb. Accompanying this, the cell drain current value is determined, and the voltages SAI, SAREF converted by the cascode circuits 18, 24 are also determined. Hence in the interval until the input voltages SAI, SAREF are determined, the output of the sense amplifier 26 is held in a neutral state by the equalizer signal EQ, and thereafter, in response to the latch signal LT, the detection level of the sense amplifier 26 is latched.

The pulse width of the address change detection signal ATD is set to an interval sufficiently long that the X decoder 14 operates after the address changes and the core-side word line C-WL is raised to the power supply voltage Vcc. This pulse width is also set such that redundancy judgment operation is completed and the boost voltage level Vbb, which has fallen due to the boosting-voltage operation of the previous read cycle, can recover sufficiently. The pulse width of the address change detection signal ATD tends to become longer when skew occurs in the external address E-Add. Skew in the address signal also tends to cause the decoder operation time to be lengthened, and this is accompanied by a lag in the timing with which the voltage in the core-side word line C-WL rises.

The voltage-boost signal KICK is a control signal to raise the word lines C-WL and R-WL to the high level Vbb while at H level. During this interval, while the equalizer signal EQ is at H level, the sense amplifier 26 detects the voltage difference of the two inputs SAI and SAREF, and the detection signal is latched by the latch signal LT. Hence simultaneously with falling of the latch signal LT, the voltage-boost signal KICK falls, and the voltages in the word lines C-WL, R-WL fall.

FIG. 3 is a timing chart of operation when skew occurs in the Y address in FIG. 2. In this example, of the external addresses E-Add, skew does not occur on the X-address side, but does occur on the Y-address side. As the X address changes without skew, operation of the X decoder 14 at a prescribed time after the time t0 at which the address change detection signal ATD rises, causes the core-side word line C-WL to rise to the power supply voltage Vcc.

On the other hand, skew occurring in the Y address is accompanied by a lengthening of the pulse width of the address change detection signal ATD, and there is a lag in the falling edge at time t1. Hence the boosting operation of the core-side word line C-WL and the rising operation of the reference-side word line R-WL are also delayed considerably.

As shown in FIGS. 2 and 3, the timing of the rising edge of the core-side word line C-WL differs from the timing of the rising edge of the reference-side word line R-WL, and so a time difference occurs in the waveform changes of the sense amplifier inputs SAI and SAREF, which change in response to these rising edges. This time difference gives rise to a period in which the operating margin of the sense amplifier is reduced; and in order to prevent erroneous operation caused by this, the pulse width of the equalizer pulse EQ which controls the sense amplifier detection period must be made long. This means that the access time is delayed. Also, when the pulse width of the equalizer pulse EQ is narrow, erroneous operation of the sense amplifier is prone to occur.

FIG. 4 is a figure which explains erroneous operation of the sense amplifier. FIG. 4A shows changes in the core-side word line and reference-side word line, and in inputs to the sense amplifier SAI(0), SAI(1), SAREF, plotted against time on the horizontal axis. FIG. 4B shows changes with time in the core-side cell currents Ic(0), Ic(1) and the reference-side cell current Ir.

Assume the worst case for data "0"s and "1"s, and suppose that a data "0" cell with a high threshold is positioned close to the X decoder, and a data "1" cell with a low threshold is positioned farthest from the X decoder. In this case, the rising waveforms of the word lines C-WL(0), C-WL(1) for each of these cells are as shown in FIG. 4A. That is, the rise of the word line C-WL(1) lags somewhat. Together with this, the cell currents Ic(0) and Ic(1) rise with the timing of time t1, at which the word line levels are raised to the boost voltage level Vbb. Of course the current Ic(0) of the high-threshold cell is small.

On the other hand, the reference-side word line R-WL lags behind the core, rising at time t1, and so lags behind the cell-side word lines C-WL in reaching the boost voltage level Vbb. Accompanying this, the rise of the reference-side cell current Ir also lags, as shown by S1.

As will be seen for the cascode circuit described below, the cascode circuits 18, 24 convert the respective cell currents (bit line currents) into voltages, and generate sense amplifier inputs SAI(0), SAI(1), SAREF. Furthermore, the cascode circuits become active on the rise of the voltage-boost signal KICK, and so the converted sense amplifier inputs SAI(0), SAI(1), SAREF rise simultaneously. However, the rising timing of the reference-side word line R-WL lags, and so the reference-side sense amplifier input SAREF overshoots, as shown by S2. This overshoot causes the sense amplifier operating margin to be decreased for a certain interval from time t1, and tends to cause sense amplifier erroneous operation or delays in sense amplifier output.

In FIG. 4, solid lines indicate ideal waveforms for the reference-side cell current Ir and reference-side sense amplifier input SAREF. However, in actuality the waveforms are like the broken lines S1, S2. The reason for this is that the rising edge of the reference-side word line R-WL is delayed.

FIG. 5 is an operation timing chart which aligns the reference-side word line R-WL with the rise timing of the core-side word line C-WL of FIG. 2. In this example, a control signal KICKR is generated which rises a prescribed delay time d1 after the rise of the address change detection signal ATD, and falls together with the voltage-boost signal KICK. The reference-side word line R-WL is made to rise to the power supply voltage Vcc with the rise timing of this new control signal KICKR. Otherwise, operation is the same as described above. Hence the core-side word line C-WL and reference-side word line R-WL are raised to the voltage-boost level Vbb at the rise timing of the voltage-boost signal KICK.

In this example, by appropriately selecting the delay time d1, the core-side word line C-WL and reference-side word line R-WL can be made to have the same waveform. That is, the waveforms of the word lines are a two-step driving waveform. However, this assumes that there is no skew whatsoever in the external address E-Add.

FIG. 6 is a flowchart of operation when skew occurs in the X address in the example of FIG. 5. The occurrence of skew in the X address is accompanied by a lengthening of the pulse width of the address change detection signal ATD. Whereas the reference-side word line R-WL rises to the power supply voltage Vcc at a constant delay time d1 after the rise of the address change detection signal ATD, the timing of the rise in the core-side word line C-WL is greatly delayed, due to a delay in the operation of the X decoder 14 caused by address skew.

As a result, the waveforms of the reference-side word line R-WL and core-side word line C-WL are in a relation opposite that of the case of FIG. 3. That is, the rise of the core-side word line C-WL lags behind the reference-side word line R-WL. Consequently the timing with which the voltage-boost level Vbb is reached is also shifted, and there occurs a time zone during which the operating margin of the above-described sense amplifier is narrowed. This is because, while the delay time d1 is constant, address skew occurs at random.

SUMMARY OF THE INVENTION

An object of this invention is to provide nonvolatile semiconductor memory with an improved sense amplifier operating margin.

In order to achieve the above object, in one aspect of this invention, nonvolatile semiconductor memory has a core-side cell array having a plurality of word lines, bit lines and memory cells; a reference-side cell array having word lines, bit line, and reference cell; and, a sense amplifier which compares a core-side input voltage corresponding to a bit line current in the core-side cell array, and a reference-side input voltage corresponding to the bit-line current in the reference-side cell array. The nonvolatile semiconductor memory also has an address change detection circuit, which generates address change detection pulses during changes in input addresses; a core-side decoder-driver, which selects and drives core-side word line; and a reference-side decoder-driver, which selects and drives reference-side word line. The core-side decoder-driver and reference-side decoder-driver drive the core-side word line and reference-side word line to the power supply voltage at a first time at the end of the address change detection pulse, and, at a second time a prescribed time after the end of the address change detection pulse, drive the core-side word line and reference-side word line to a boost voltage level higher than the power supply voltage. The sense amplifier begins comparison of the core-side input voltage and the reference-side input voltage after the second time.

In the above invention, the core-side word line and reference-side word line are driven to the power supply voltage at a first time when the address change ends, and then, at a subsequent second time, are driven to a boost voltage level. Hence the driving waveforms of both word lines are substantially the same. As a result, the delay relationship between the currents of the two cells, and the delay relationship between the voltage waveforms input to the sense amplifier are eliminated, erroneous reading by the sense amplifier is prevented, and readout speed can be increased.

DESCRIPTION OF THE PREFERRED EMBODIMENTS

Figure 1:
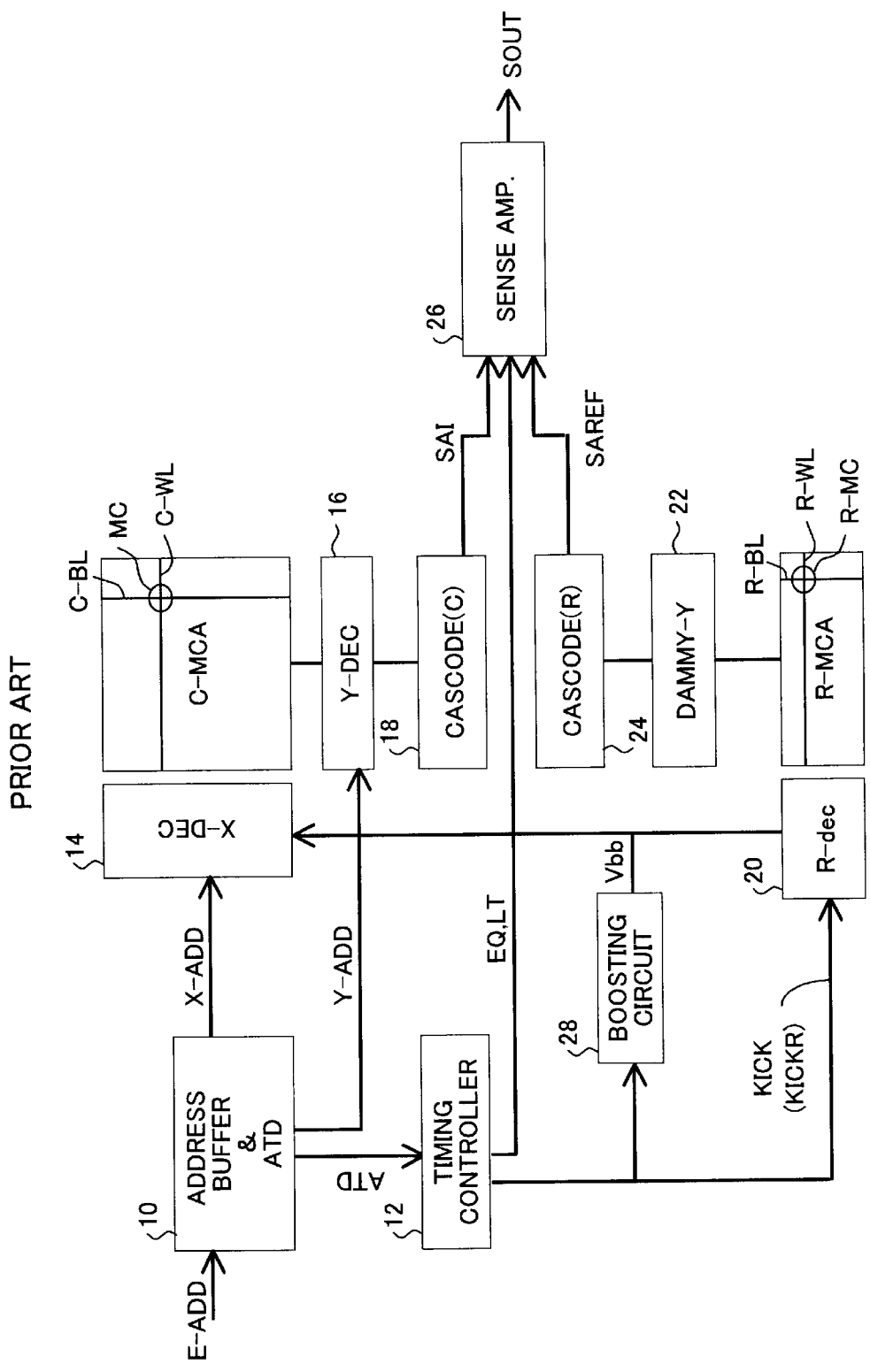
FIG. 1 is a drawing of the configuration of conventional nonvolatile memory.
Figure 2:
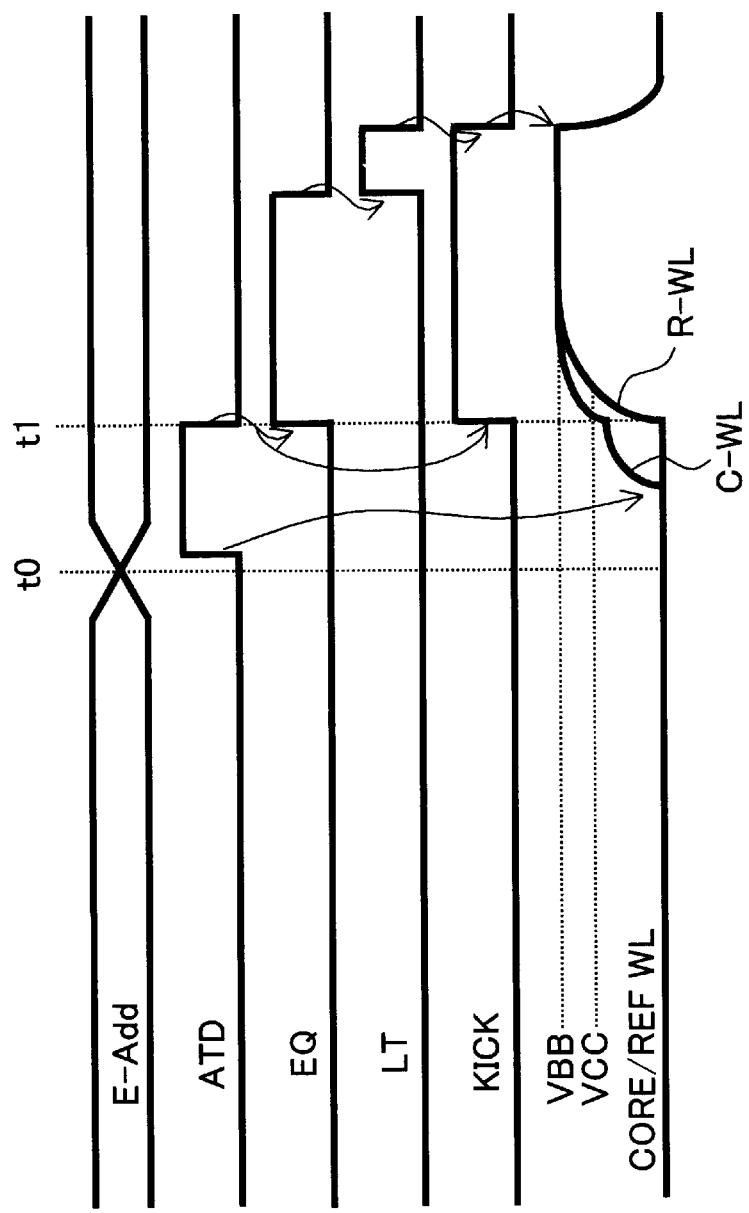
FIG. 2 is a timing chart of the operation of conventional nonvolatile memory.
Figure 3:
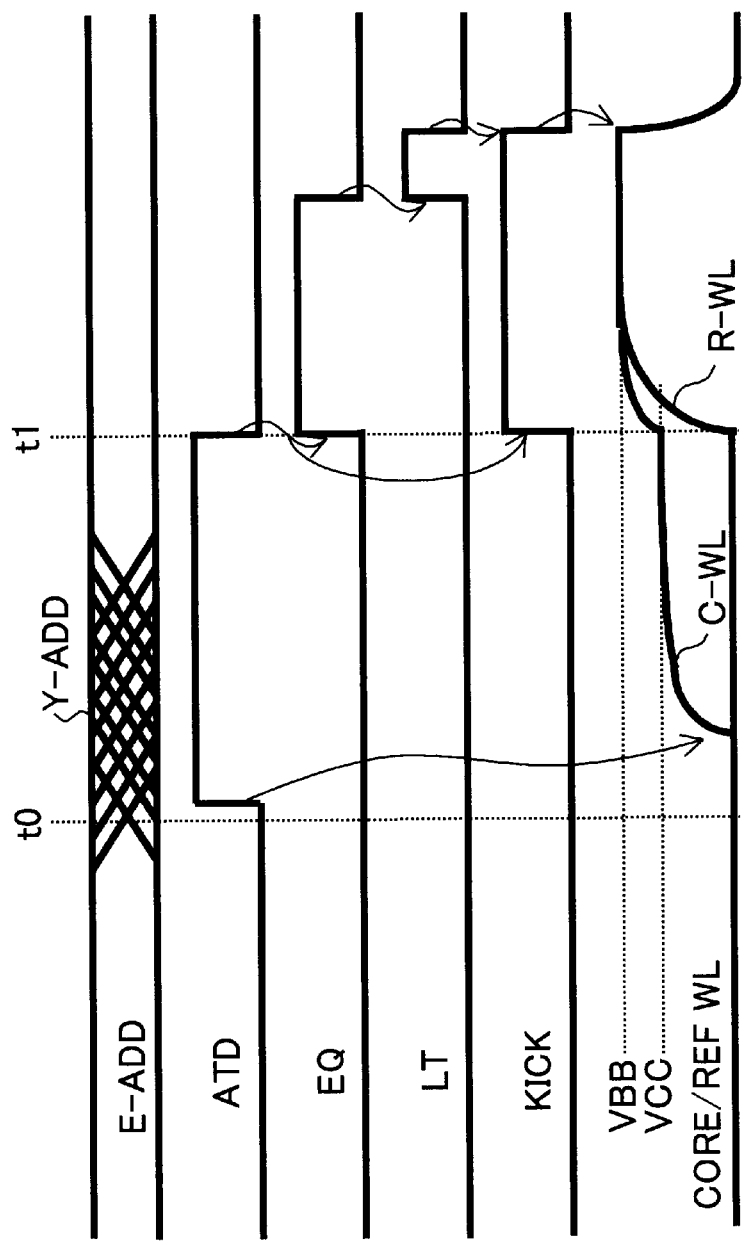
FIG. 3 is a timing chart of the operation when skew occurs in the Y address in the example of FIG. 2.

Below, aspects of this invention are explained, referring to the drawings. However, the scope of protection of this invention is not limited to the following aspects, but extends to the invention described in the scope of claims, and to the equivalent thereof.

Figure 7:
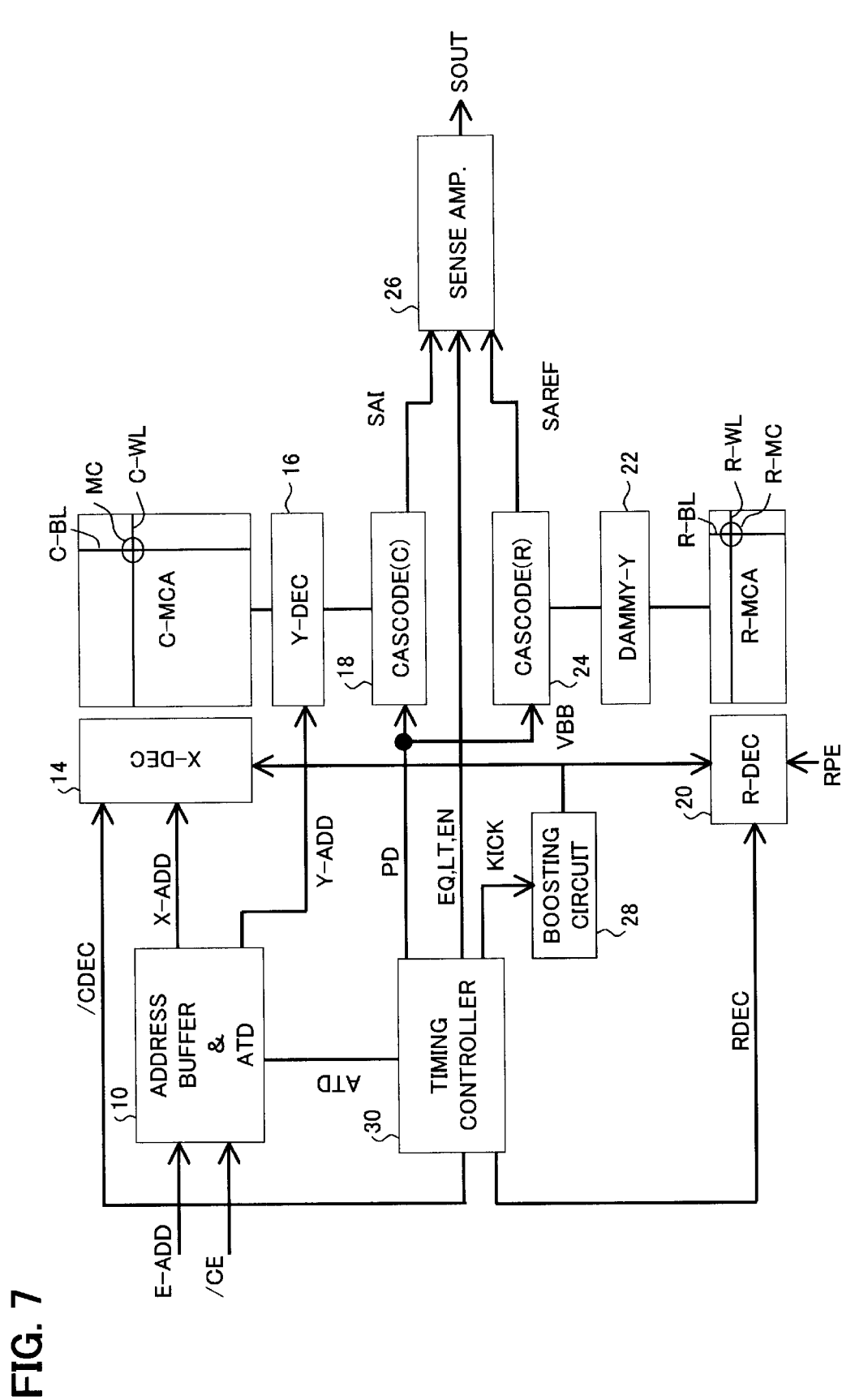
FIG. 7 is a figure of the overall configuration of the nonvolatile semiconductor memory of this embodiment.

FIG. 7 is a figure of the overall configuration of the nonvolatile semiconductor memory of this embodiment. This memory has an address buffer to which is input the external address E-Add, and an address change detection circuit 10. The address change detection circuit 10 detects changes in the input address E-Add and generates an address change detection signal ATD while the chip-enable signal /CE is at active level. The pulse width of the address change detection signal ATD is set to a value which adds, to the interval in which the address E-Add is changing, the interval required for the pre-decode operation of the decoder in response to address changes. Hence the address change detection signal ATD is lengthened according to the occurrence of skew in the address E-Add.

The core-side memory cell array C-MCA has a plurality of word lines C-WL, a plurality of bit lines C-BL which intersect the word lines, and a plurality of memory cells C-MC positioned at the intersection positions. Memory cells C-MC have, for example, a floating gate, and comprise a cell transistor the threshold voltage of which changes according to the amount of charge injected into the floating gate. The core side has an X decoder 14, which decodes the X address X-Add supplied from the address buffer 10, and drives the selected word line C-WL; a Y decoder Y-dec, which decodes the Y address Y-Add and selects the bit line; and a cascode circuit 18, which current-voltage converts the current of the selected bit line, and outputs a core-side sense amplifier input voltage SAI.

On the other hand, the reference-side memory array R-MCA has a bit line R-BL, a plurality of word lines R-WL, and reference cells R-MC positioned at the intersecting positions. The reference-side decoder 20 decodes a read-program-erase signal RPE supplied by an operation control circuit, not shown, and selects and drives a word line corresponding to the read, program, or erase operation. The reference side also has a dummy circuit 22 in order to provide the reference-side bit line with a load equivalent to the core-side bit line load, and a cascode circuit 24 which current-voltage converts the reference-side bit line current and generates a reference-side sense amplifier input SAREF.

Based on the address change detection signal ATD, the timing control circuit 30 generates a sense amplifier activation signal EN, equalize signal EQ, latch signal LT, cascode circuit power-down signal PD, and voltage-boost signal KICK. The timing control circuit 30 generates a core-side driving timing signal /CDEC which controls the timing for driving the selected core-side word line C-WL to the power supply voltage, and a reference-side driving timing signal RDEC which controls the timing for driving the selected reference-side word line R-WL to the power supply voltage. These driving timing signals /CDEC and RDEC are generated synchronously with the end of the address change detection signal ATD pulse. In this aspect, these driving timing signals are reverse-phase signals; the signal /CDEC is an L-level active signal, and the signal RDEC is an H-level active signal.

The voltage-boost circuit 28 supplies the boost voltage Vbb to the core-side X decoder 14 and reference-side decoder 20 in response to a voltage-boost signal KICK generated by the timing control circuit 30. By means of the supply of this boost voltage Vbb, the word lines C-WL, R-WL which have been selected by the decoders 14, 20 are each driven to the boost voltage level Vbb.

The cascode circuits 18, 24 are normally held in the inactive state by the power-down signal PD; when the power-down signal PD is canceled synchronously with the voltage-boost signal KICK, these circuits enter an activated state, and generate sense amplifier input voltages SAI, SAREF corresponding to the cell currents.

Figure 8:
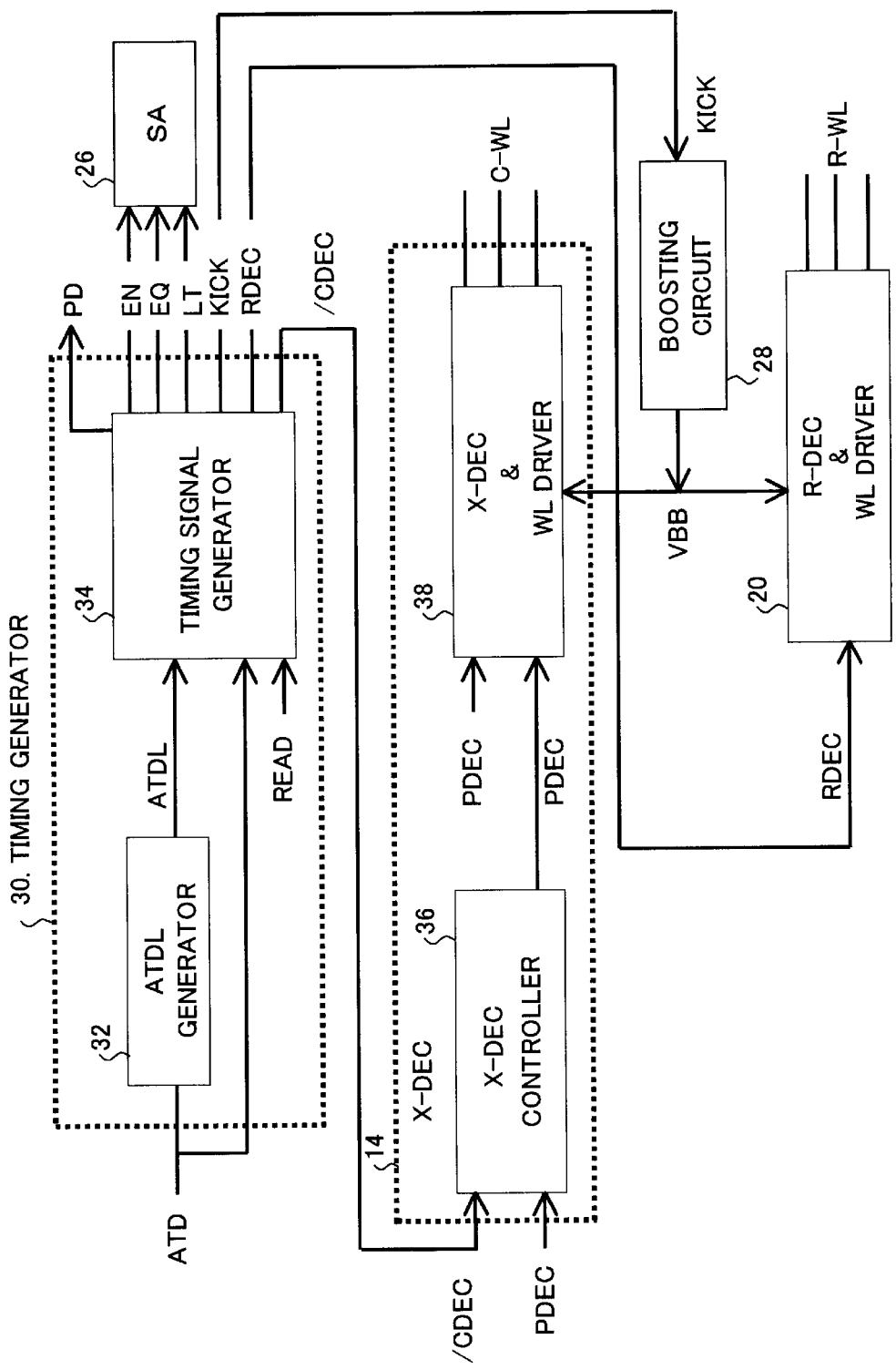
FIG. 8 is a figure showing a timing control circuit and its control signals.
Figure 9:
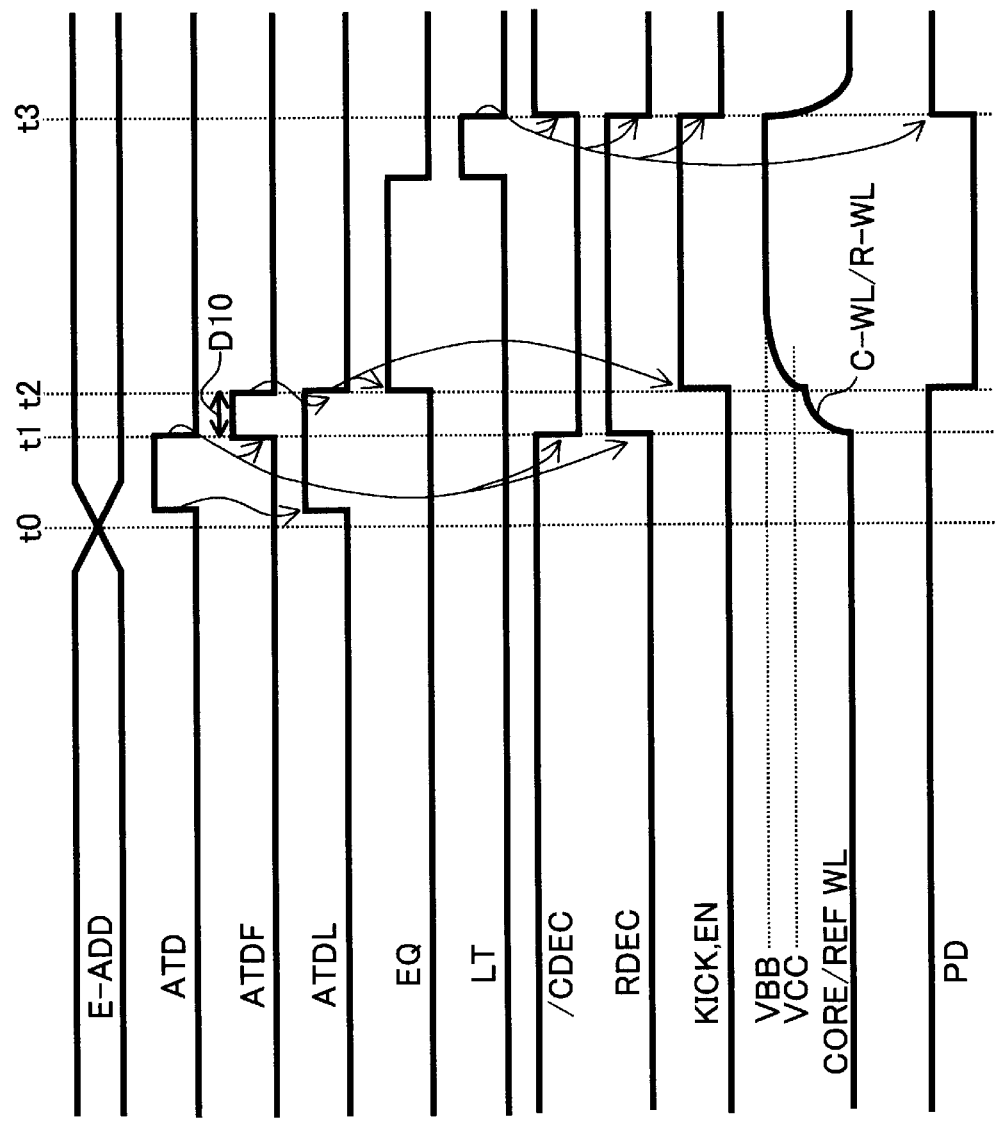
FIG. 9 is a timing chart of read operations in the memory of this embodiment.

FIG. 8 is a figure showing a timing control circuit and its control signals. FIG. 9 is a timing chart of read operations in the memory of this embodiment. The timing control circuit 30 has an ATDL generation circuit 32 which, in response to an address change detection signal ATD, generates a second address change detection signal ATDL with a pulse width longer than the ATD signal. The second address change detection signal ATDL rises with the timing of the rising edge of the address change detection signal ATD, and falls a fixed length of time d10 after the falling edge of the same signal, as shown in FIG. 9. Hence the second address change detection signal ATDL has a falling edge which is delayed compared with the address change detection signal ATD, and has a longer pulse width. The ATDF signal with pulse width d10 shown in FIG. 9 is generated within the ATDL generation circuit 32, and is utilized in generating the second address change detection signal ATDL. This is explained in detail below.

The timing control circuit 30 also has a timing signal generation circuit 34 which generates various timing signals according to the read control signal READ and the two address change detection signals ATD, ATDL. The timing signal generation circuit 34 is also explained in detail below.

The sense amplifier 26 enters the activated state in response to an enable signal EN. However, as explained below, while the equalize signal EQ is at H level, no comparison result is output, so that noise and erroneous operations accompanying fluctuations in the input voltages SAI and SAREF are prevented. When the input voltages SAI and SAREF are stabilized, the equalize signal EQ goes to L level, and a comparison result is latched in response to the latch signal LT and output.

The core-side X decoder 14 has an X decoder control circuit 36 and a decoder and word line driver 38. A pre-decode signal PDec resulting from pre-decoding of an external address E-Add, and a core-side driving timing signal /CDEC, are input to the X decoder control circuit 36, and in response to the falling edge of the core-side driving timing signal /CDEC, the pre-decode signal PDec is supplied to the decoder and word line driver 38. In response to this, the decoder and word line driver 38 drives the core-side word line C-WL to the power supply voltage Vcc. Further, in response to the voltage-boost signal KICK, and according to the boost voltage Vbb generated by the voltage-boost circuit 28, the decoder and word line driver 38 drive the selected core-side word line C-WL to the boost voltage level Vbb. That is, driving of the core-side word line C-WL to the boost voltage level Vbb is performed synchronously with the voltage-boost signal KICK.

On the other hand, the reference-side decoder and word line driver 20 also drives the reference-side word line R-WL to the power supply voltage Vcc in response to the rising edge of the reference-side driving timing signal RDEC. In response to the subsequent voltage-boost signal, and according to the boost voltage Vbb generated by the voltage-boost circuit 28, the decoder and word line driver 20 drives the selected reference-side word line R-WL to the boost voltage level Vbb. That is, driving of the reference-side word line R-WL to the boost voltage level Vbb is also performed synchronously with the voltage-boost signal KICK.

Read operations are explained referring to FIG. 9. At time t0, when the external address E-Add changes, the address change detection signal ATD is generated. The pulse width is controlled to such a length that the address signal change ends, and decoding operation of the address signal ends. The ATDL generation circuit 32 generates a pulse signal ATDF which rises in synchronization with the falling edge of the address change detection signal ATD, and which has a pulse width d10. Hence the second address change detection signal ATDL rises in synchronization with the rising edge of the address change detection signal ATD, and falls in synchronization with the falling edge of the pulse signal ATDF.

Similarly to the prior art, the timing signal generation circuit 34 generates an enable signal EN, equalize signal EQ, and latch signal LT for the sense amplifier, and a power-down signal PD for the cascode circuits, based on the second address change detection signal ATDL. That is, the power-down signal PD is set to L level to activate the cascode circuits and the enable signal EN is set to H level to activate the sense amplifier, in synchronization with the falling edge of the second address change detection signal ATDL. As described above, output from the sense amplifier 26 is forbidden while the equalize signal EQ is at H level; in response to a change in the latch signal LT to H level, the comparison result is latched and output.

The falling edge (at time t1) of the address change detection signal ATD is the timing with which decoder operation is completed. Hence with this timing (at time t1), the timing signal generation circuit 34 sets the driving timing signals /CDEC, RDEC, which control word line driving by the core-side X decoder 14 and the reference-side decoder 20, to L level and H level respectively. With this timing, the word lines C-WL, R-WL are driven to the power supply voltage Vcc.

The timing signal generation circuit 34 sets the voltage-boost signal KICK to H level in synchronization with the falling edge of the second address change detection signal ATDL. Hence the falling edge (at time t2) of the second address change detection signal ATDL is the timing for activation of the cascode circuits and sense amplifier, and is also the timing for driving the core-side word line C-WL and reference-side word line R-WL to the boost voltage level Vbb.

Conventionally, driving of the selected word line by the core-side X decoder 14 has been performed accompanying the end of decode operation of the X decoder 14 corresponding to an address change. Hence as explained in the example of the prior art (FIGS. 2, 3, 5, 6), the timing with which the word line C-WL is driven fluctuates according to the number of changes of the X address X-Add and the skew. Also, at an amount of time after the end of the decoding operation which takes a certain margin into account, the voltage-boost signal KICK is generated, and the selected word line C-WL is driven to the boost voltage level. Because the selected word line R-WL during reading is fixed, the reference-side decoder 20 drives the word line R-WL from ground to the boost voltage level in synchronization with the voltage-boost signal KICK without decoding.

As a result, in the prior art example, the timing for driving of the core-side word line C-WL is not controlled, but fluctuates according to the skew; further, the waveform for driving to the boost voltage level is different for the core-side word line C-WL and for the reference-side word line R-WL.

In the above aspect, the manner in which the core-side word line C-WL is driven to the boost voltage level Vbb together with the reference-side word line R-WL after the core-side X decoder 14 has reliably driven the word line C-WL to the power supply voltage Vcc is the same; but both word lines C-WL and R-WL are driven to the power supply voltage Vcc by means of the driving timing signals /CDEC, RDEC with timing t1, which is earlier than this by a prescribed time d10. The driving timing signals /CDEC, RDEC are used to control word line driving by the X decoder 14 and the decoder 20, so that even if the driving timing of the core-side word line C-WL differs corresponding to a changing address signal, the reference-side word line R-WL is simultaneously driven to the power supply voltage Vcc as the core-side word line C-WL. As a result, the driving waveforms for both word lines are substantially the same.

The core-side X decoder 14 must boost the selected word line to the boost voltage level Vbb, and internally has a level shift circuit which boosts the word line selection signal. Hence after the decode operation is completed and word line selection is determined, it is desirable that the voltage-boost signal KICK be generated.

Of course depending on the configuration of the core-side X decoder, both word lines can be simultaneously driven from ground to the boost voltage level on the falling edge of the second address change detection signal ATDL.

The pulse width of the equalize signal EQ is set to the time required for stabilization of the sense amplifier input level. The latch signal LT rises in synchronization with the falling edge of the equalization signal EQ, so that the sense amplifier comparison result is output. The timing signal generation circuit 34 lowers the voltage-boost signal KICK, raises the driving timing signal /CDEC, and lowers the other driving timing signal RDEC in synchronization with the falling edge (at time t3) of the latch signal LT, to end driving of both word lines C-WL and R-WL. At the same time, the enable signal EN falls, the power-down signal PD rises, and the sense amplifier 26 and cascode circuits 18, 24 are put into the inactive state.

To summarize the above:

(1) The address change detection signal ATD is a pulse which detects an address change and rises, and then when the address is determined, falls with the timing of the end of the decode operation.
(2) The pulse signal ATDF is a pulse of prescribed length, for example several nanoseconds, which is triggered by the falling edge of the ATD signal.
(3) The second address change detection signal ATDL is a pulse which rises on being triggered by the rising edge of the ATD signal, and falls on being triggered by the falling edge of the ATDF signal.
(4) The driving timing signal /CDEC is a pulse which, while at H level, stops word line driving by the core-side X decoder 14, which goes to L level on the falling edge of the ATD signal to drive the word line C-WL to the power supply level.
(5) The driving timing signal RDEC is a pulse which, while at L level, stops word line driving by the reference-side decoder 20, which goes to H level on the falling edge of the ATD signal to activate the decoder RDEC and drive the word line R-WL to the power supply level.

Figure 10:
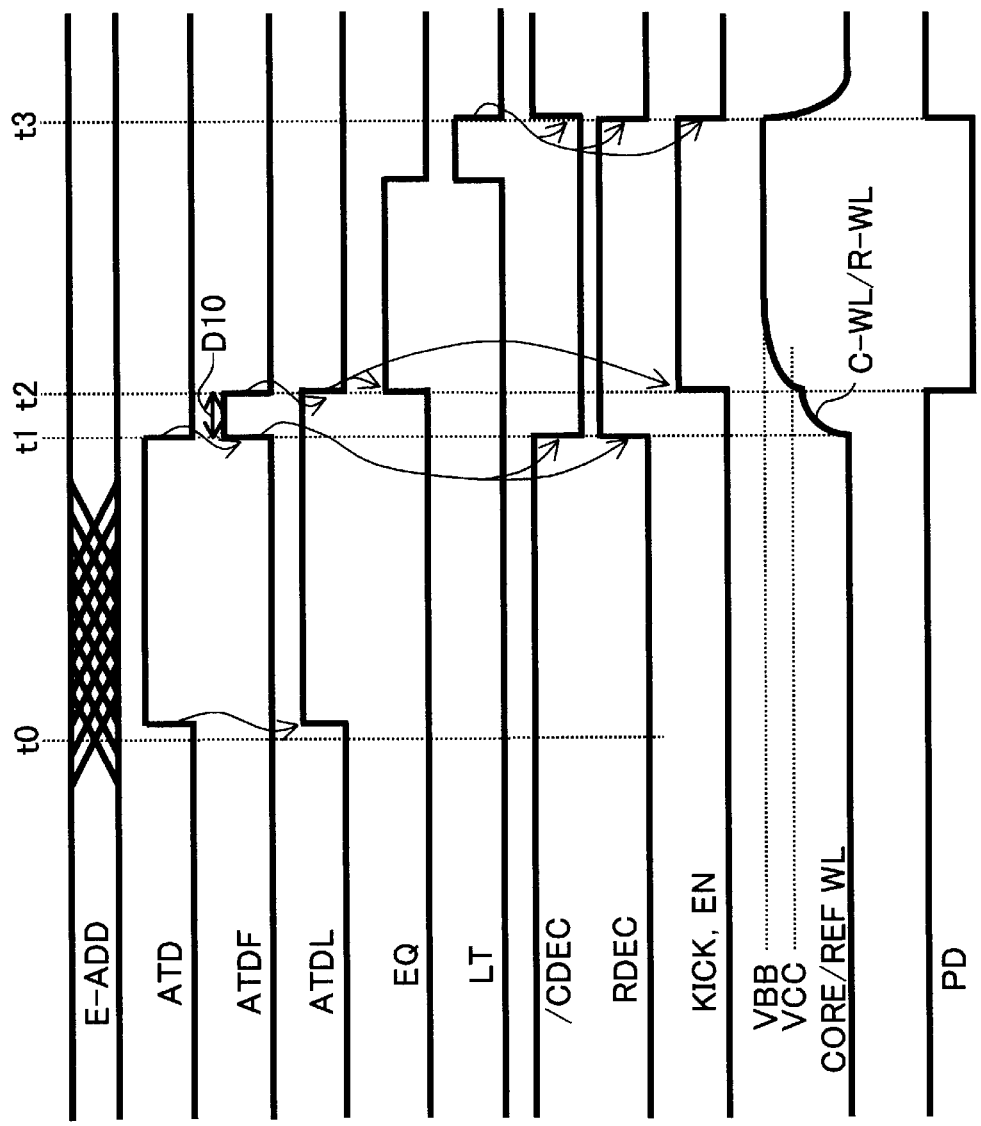
FIG. 10 is timing chart of operations when skew occurs in an address.

FIG. 10 is timing chart of operations when skew occurs in an address. That is, FIG. 10 shows the operation of this aspect corresponding to FIGS. 3 and 6. Due to the occurrence of skew in the address, an address change detection signal ATD is generated having a pulse width equal to the interval during which the address is changing and the interval required after this for pre-decode operation to end. Hence the interval from the time t0 of the start of the address change until the time t1 of the falling edge of the address change detection signal ATD is longer than in FIG. 9.

However, in this aspect the falling edge of the core-side driving timing signal /CDEC and the rising edge of the reference-side driving timing signal RDEC occur in synchronization with the falling edge of the address change detection signal ATD (time t1), so that driving of both the word lines C-WL and R-WL is forbidden until time t1. At time t1, the two word lines C-WL, R-WL are, for the first time, simultaneously driven to the power supply voltage Vcc. However, prior to time t1 decoding of the changed address is performed, and only driving of the word lines to the power supply voltage is forbidden by the driving timing signal.

At time t2, a certain delay time d10 later, the second address change detection signal ATDL falls, and in synchronization with this falling edge, the voltage-boost signal KICK rises, and both word lines C-WL, R-WL are driven to the boost voltage level Vbb. At the same time t2, the power-down signal PD falls, the cascode circuits 18, 24 are activated, and the input voltages SAI, SAREF are supplied to the sense amplifier 26; at the same time, the enable signal EN also rises, and the sense amplifier 26 begins the comparison operation.

In this way, even if skew occurs in the address, the driving waveforms of the core-side word line C-WL and the reference-side word line R-WL are in agreement, the timing with which cell currents rise accompanying this also agree, and the sense amplifier input waveforms are also in agreement. Hence there is no reduction of the operating margin of the sense amplifier.

Figure 11:
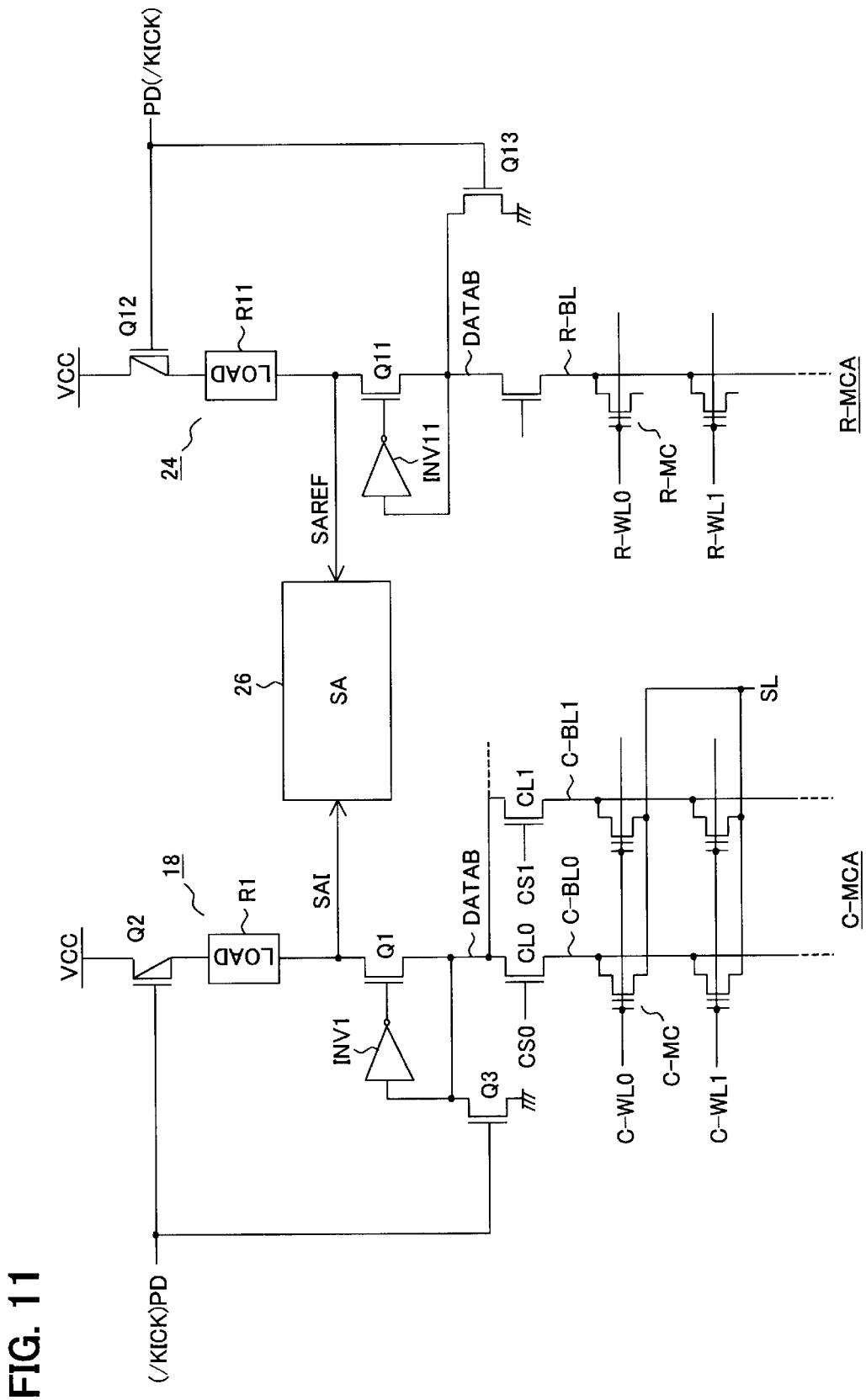
FIG. 11 is a circuit diagram of the cascode circuit and memory cell array of this embodiment.

FIG. 11 is a circuit diagram of the cascode circuit and memory cell array of this embodiment. In the figure, the core-side circuitry is shown on the left, and the reference-side circuitry appears on the right. The core-side memory cell array C-MCA has word lines C-WL, bit lines C-BL, and memory cells C-MC having floating gate. The cascode circuit 18 is connected to the bit lines via the column select transistors CL. The cascode circuit 18 has a load R1 connected via a P-type transistor Q2 to the power supply Vcc; a current-adjustment transistor Q1 provided between the load R1 and the node DATAB, connected in common to the column select transistors CL; an inverter INV1 which inverts the potential of the node DATAB to control the transistor Q1; and an N-type transistor Q3 which holds the node DATAB at ground level. The node between the load R1 and the transistor Q1 is the input to the sense amplifier 26 as the core-side sense amplifier input voltage SAI.

The reference side has nearly the same configuration; the reference memory cell array R-MCA has word lines R-WL, a bit line R-BL, and reference memory cells R-MC. The reference memory cells R-MC comprise cells with different accumulated amounts of charge in the floating gates according to the purpose, whether for reading, for program verification, erase verification, or other operations. These memory cells R-MC are selected by a read-program-erase control signal, not shown. The reference-side cascode circuit 24 has the same configuration as on the core side.

The cascode circuits 18, 24 enter the inactive state while the power-down signal PD is at H level. That is, the transistors Q2, Q12 are turned off, the transistors Q3, Q13 are turned on, the node DATAB is at ground potential, the transistors Q1, Q11 are both conductive, and the sense amplifier input voltages SAI, SAREF are both at ground potential. When, at time t2, the power-down signal PD goes to L level, the transistors Q2, Q12 are turned on and the transistors Q3, Q13 are turned off, and the cascode circuits enter the active state. That is, the cell current and current from the load R1 flow into the node DATAB, and the sense amplifier input voltages SAI, SAREF rise to voltages according to the cell currents. This is as shown in FIG. 4.

That is, as the cell current increases, the outputs of the inverters INV1, INV11 rise accordingly, the transistors Q1, Q11 pass larger currents, and the levels of the sense amplifier input voltages SAI, SAREF drop. On the other hand, when cell currents are small, the levels are high.

Figure 4A:
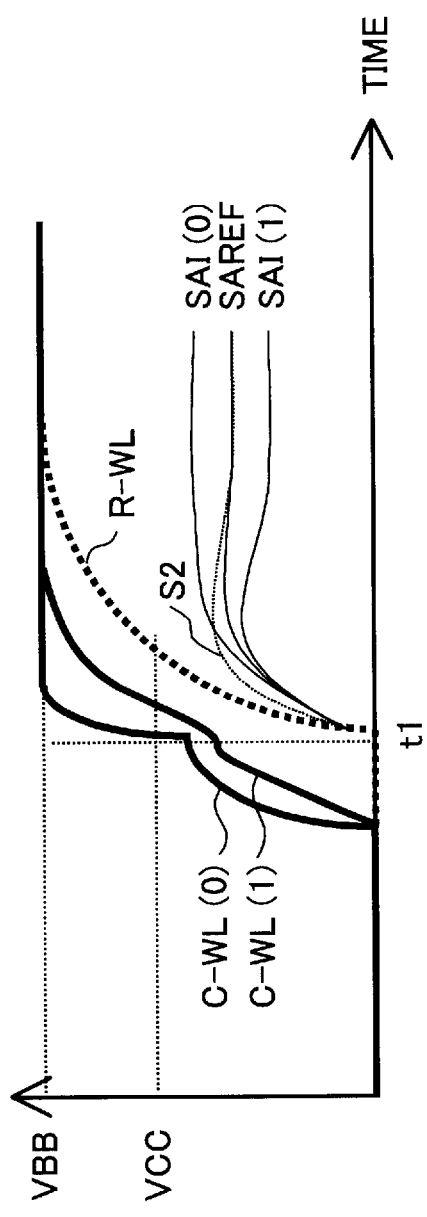
FIGS. 4a and 4b are figures used to explain erroneous operation of a sense amplifier.
Figure 4B:
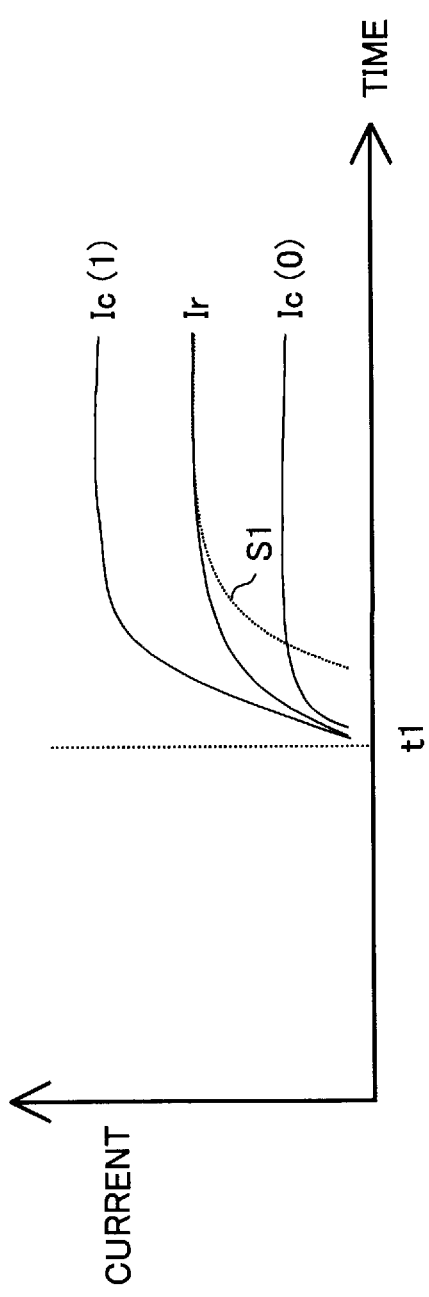
Figure 5:
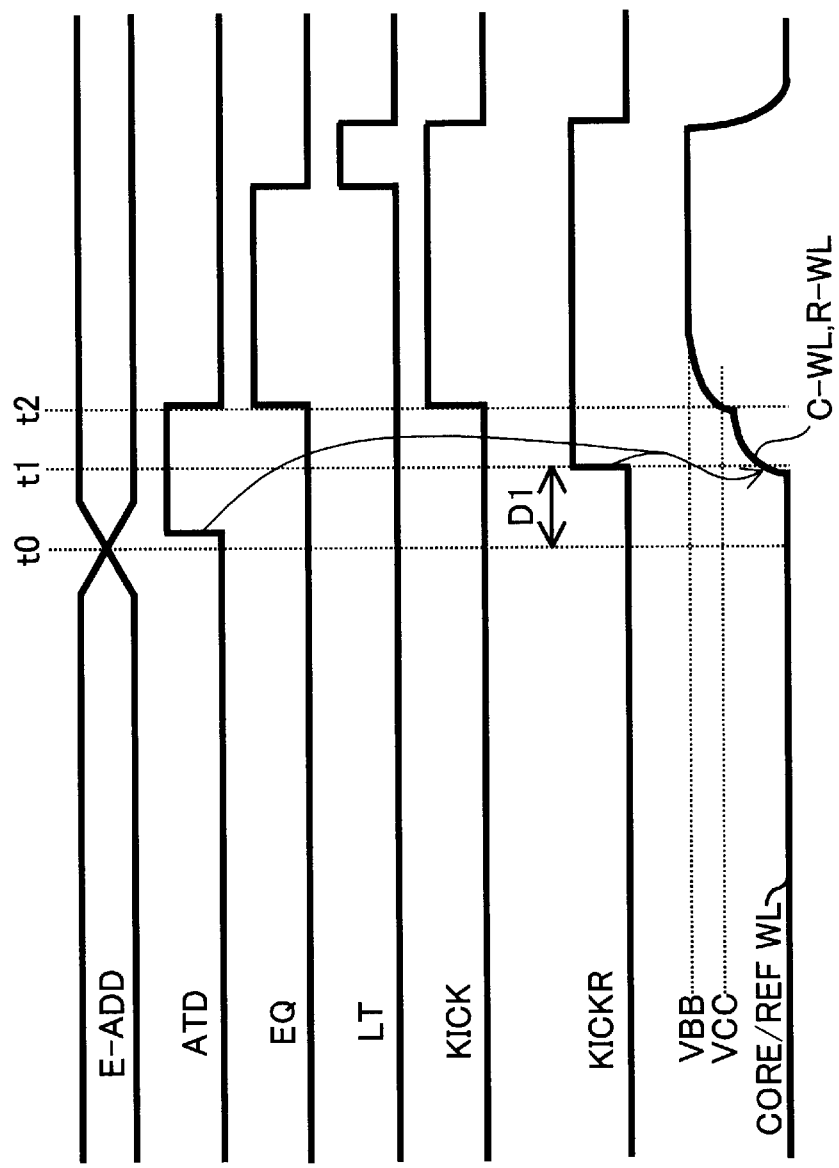
FIG. 5 is an operation timing chart which aligns the reference-side word line R-WL with the rise timing of the core-side word line C-WL in FIG. 2.
Figure 6:
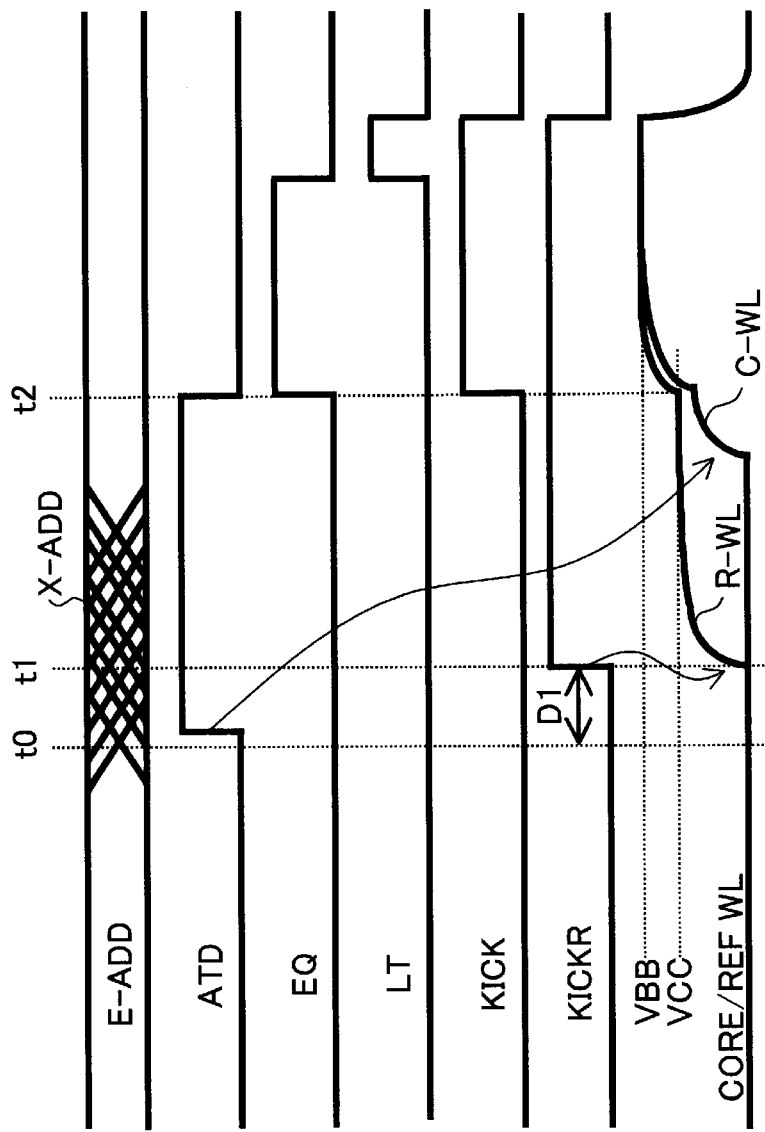
FIG. 6 is a timing chart of the operation when skew occurs in the X address in the example of FIG. 5.

In this way, the sense amplifier input voltages SAI, SAREF generated by the cascode circuits 18, 24 rise as shown in FIG. 4 in response to the falling of the power-down signal PD at time t2. Furthermore, the timing for driving of the core-side word line C-WL and reference-side word line R-WL to the boost voltage level is the same, so that the timing of the rising edges of the sense amplifier input voltages SAI, SAREF is substantially the same. This is as shown by the solid lines in FIG. 4.

Figure 12:
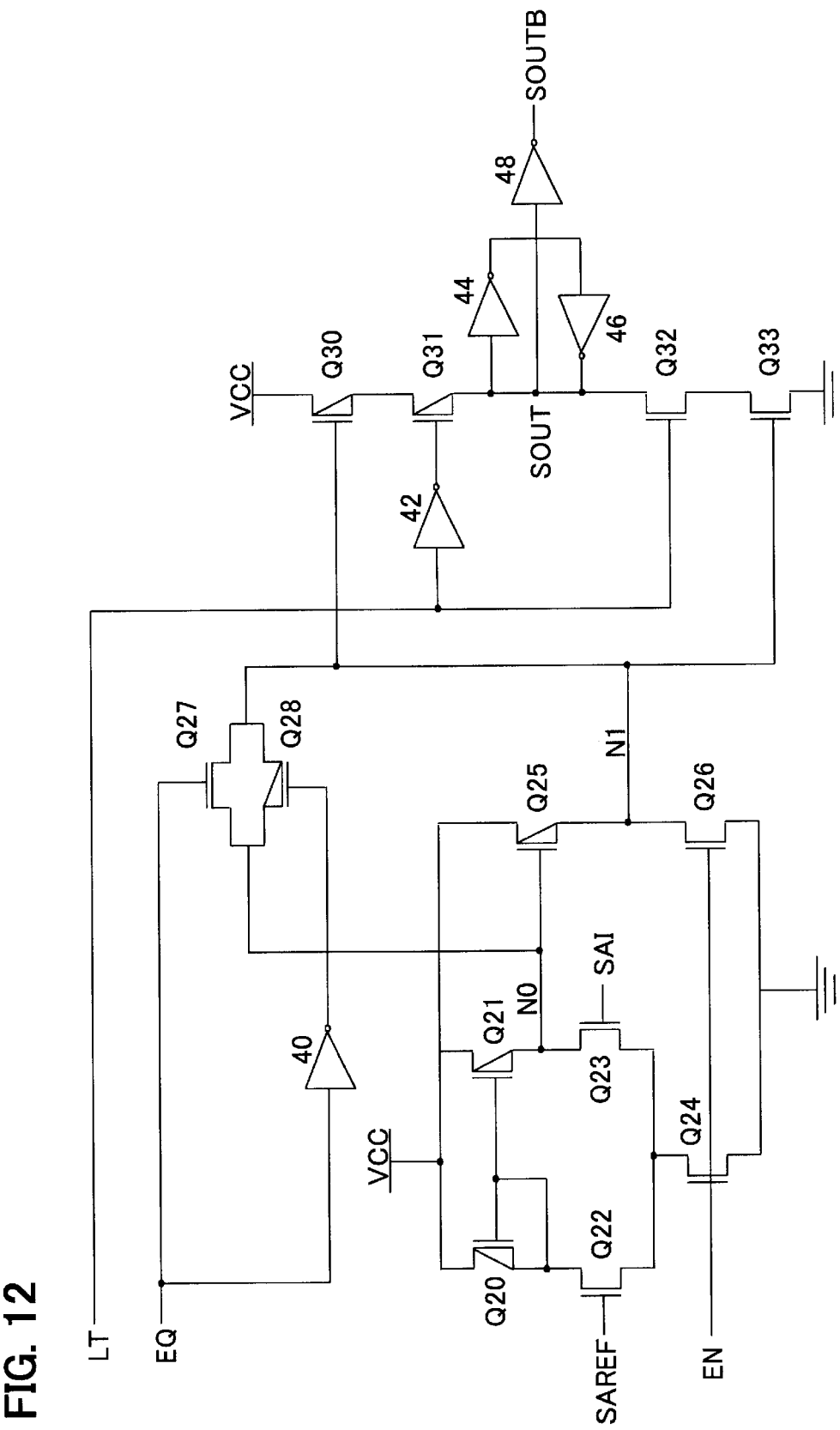
FIG. 12 is a circuit diagram of the sense amplifier of this embodiment.

FIG. 12 is a circuit diagram of the sense amplifier of this embodiment. A comparison circuit which compares the two input voltages SAI, SAREF of the sense amplifier comprises the current mirror circuit of the transistors Q20, Q21, a pair of comparison transistors Q22, Q23, and a current source transistor Q24; when the enable signal EN is at H level, the comparison operation is in the activated state. The node n0 which is the output of this comparison circuit is inverted at the output node n1 via the P-type transistor Q25. The transistor Q26 is a current source transistor which is made conducting by the enable signal EN.

The output node n1 is further connected to the gates of the transistors Q30 and Q33 comprised by the output stage inverter, and the output SOUT of the output stage inverter is latched by a latch circuit comprising two inverters 44, 46. This output SOUT becomes the inverted output SOUTB via the inverter 48.

While the equalize signal EQ is at H level, the transfer gate comprising the transistors Q27, Q28 is conducting, and the nodes n0, n1 are short-circuited. Hence the comparison result due to the transisters Q22, Q23 cannot be transmitted to the node n1. Further, when the latch signal LT goes to H level, the transisters Q31, Q32 of the output stage inverter become conducting and enter the activated state, and the level of node n1 is inverted and is latched by the latch circuit 44, 46.

As shown in the timing charts of FIGS. 9 and 10, comparison operation of the sense amplifier 26 is activated as a result of the enable signal EN going to H level. However, in the first certain interval the equalize signal EQ goes to H level, and the occurrence of noise at the node n1 due to fluctuation of the input voltages SAI, SAREF is prevented. When the equalize signal EQ goes to L level, the short-circuited state of the nodes n0, n1 is canceled, and the node n1 changes to the inverted level of the comparison result. This change is latched by the latch circuit 44, 46 in response to the H level of the latch signal LT.

Figure 13:
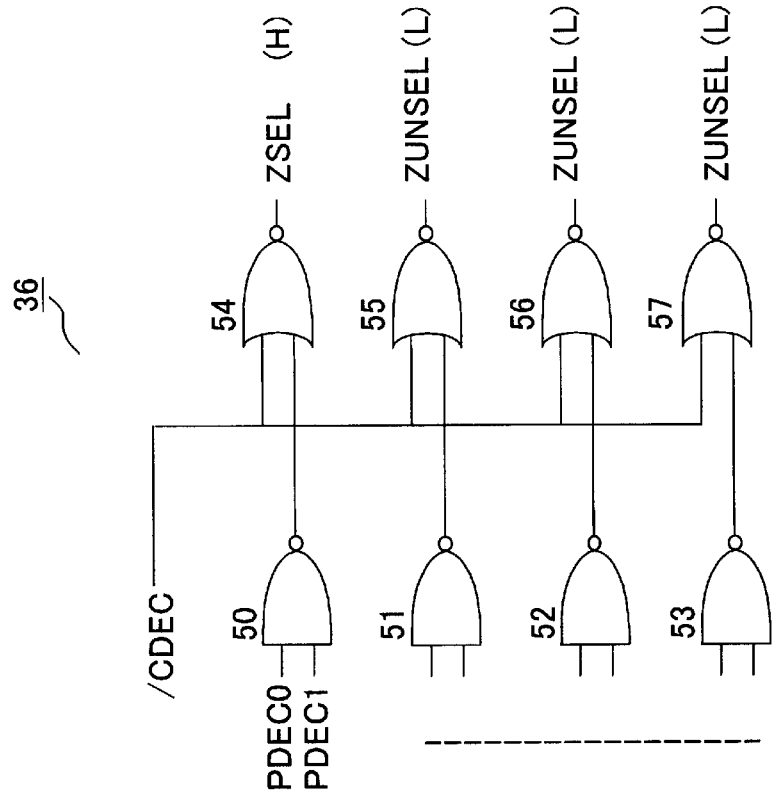
FIG. 13 is a circuit diagram of the X decoder control circuit of this embodiment.

FIG. 13 is a circuit diagram of the X decoder control circuit of this embodiment. This X decoder control circuit 36 receives as input the combination of pre-decode signals Pdec0, 1 generated by the pre-decode circuit, not shown, and generates four pre-decode signals Zsel, Zunsel, and also controls the timing for output of the pre-decode signals Zel, Zunsel by means of the driving timing signal /CDEC. In the example of FIG. 13, of the four NAND gates 50 to 53 to which the combination of pre-decode signals PDec0, 1 are input, the output of gate 50 goes to L level, and the outputs of the remaining gates 51 to 53 go to H level. However, while the driving timing signal /CDEC is at H level, the outputs of the later-stage NOR gates 54 to 57 all go to L level, and all enter the unselected state. At time t1, when the driving timing signal /CDEC goes to L level, only the output Zsel of the NOR gate 54 goes to H level. Hence through the driving timing signal /CDEC, the timing for driving of the word line C-WL by the later-stage decoder and word-line driver is controlled.

Figure 14:
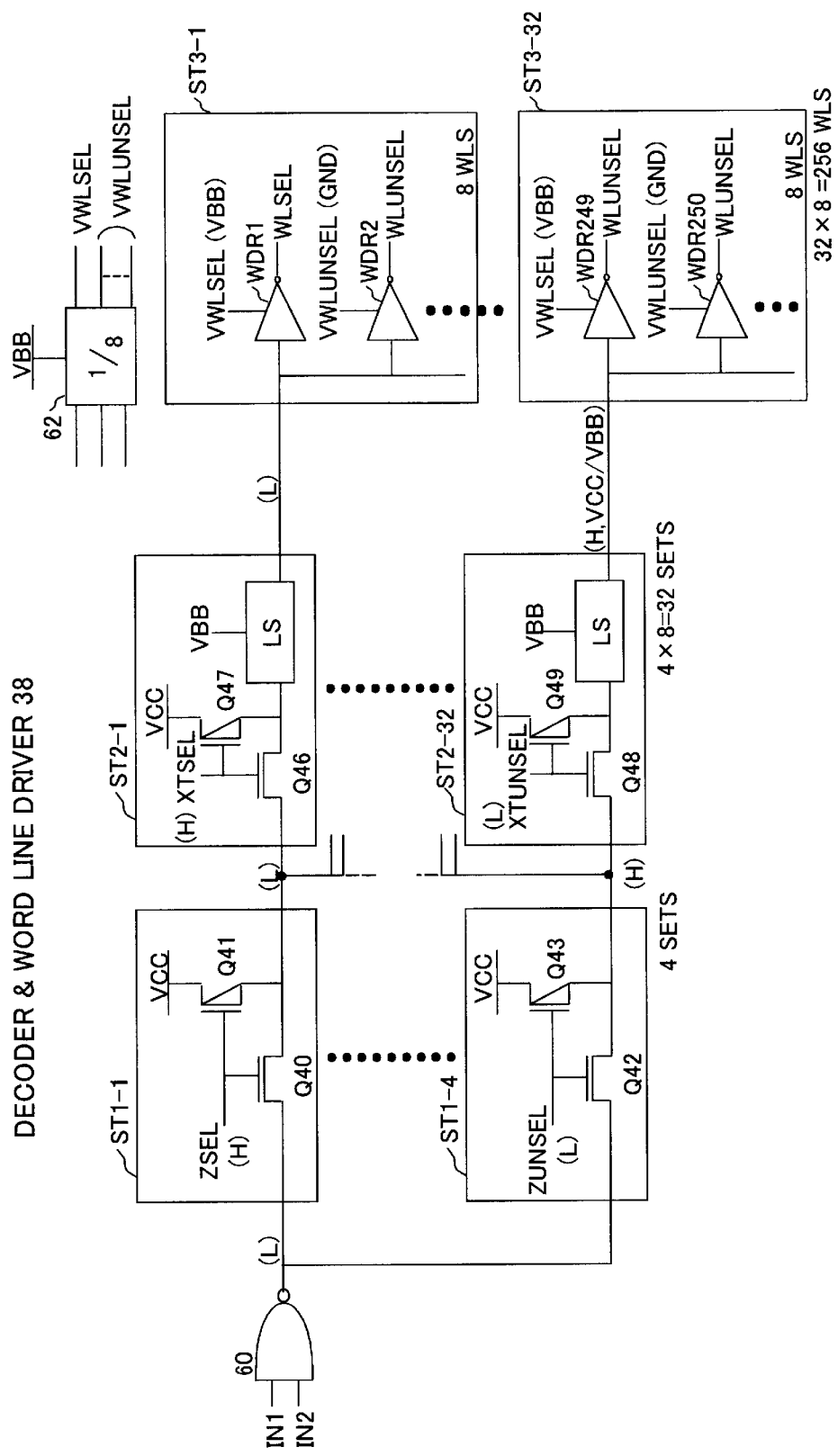
FIG. 14 is a circuit diagram of the decoder and word line driver of this embodiment.

FIG. 14 is a circuit diagram of the decoder and word line driver of this embodiment. As shown in FIG. 8, this circuit is the circuit of the later stage of the X decoder 14, to which are input pre-decode signals Zsel, Zunsel from the X decoder control circuit 36 and pre-decode signals IN1, IN2, XTsel, XTunsel from the pre-decoder, not shown. Also, the word line driving voltage signals Vwlsel, Vwlunsel generated by the pre-decoder 62 are supplied. The word line driving voltage signal Vwlsel becomes the power supply voltage Vcc and the boost voltage Vbb.

First, the NAND gate 60 decodes the pre-decode signals IN1, IN2, and if in the selected state, outputs L level. The pre-decode signals Zsel (L level) and Zunsel (H level) generated by the X decoder control circuit 36 shown in FIG. 13, and the output of the NAND gate 60, are supplied to the four sets of first-stage circuits ST1-1 to ST1-4. These first-stage circuits have N-type transistors Q40, Q42 and P-type transistors Q41, Q43. In the first-stage circuit ST1-1 to which the pre-decode signal Zsel (H level) is supplied, the transistor Q40 becomes conducting and the transistor Q41 becomes non-conducting, and the L level is transmitted to the later stage. In the other first-stage circuits ST1-2 to ST1-4, to which the pre-decode signal Zunsel (L level) is supplied, the transistor Q42 becomes non-conducting and the transistor Q43 becomes conducting, and the H level (Vcc level) is transmitted to the later stage.

The output of each of the first-stage circuits is supplied to eight sets respectively of second-stage circuits ST2-1 to ST2-32. As in the first-stage circuits, these second-stage circuits also have N-type transistors Q46, Q48 and, P-type transistors Q47, Q49 connected to the power supply Vcc. Pre-decode signals XTsel (H level), XTunsel (L level) from the pre-decode circuit, not shown, are supplied to the gates of the respective transistors Q46, Q47 and Q48, Q49. Hence even if the output of a first-stage circuit is L, of the second-stage circuits connected to this, those to which a selection pre-decode signal XTsel (H level) is supplied will also have an L level output, but those to which an unselected pre-decode signal XTunsel (L level) is supplied will have an H level output.

A level-shift circuit LS which boosts the power supply Vcc level to the boost voltage level Vbb is provided in the second-stage circuits. Hence when the boost voltage Vbb is supplied to the level-shift circuit LS, the H level is boosted from the power supply voltage Vcc to the boost voltage level.

The outputs of the second-stage circuits ST2-1 to ST2-32 are output to the third-stage circuits ST3-1 to ST3-32 respectively, each having eight sets of word line drivers WDR1. These word line drivers WDR are circuits which invert the input level and drive word lines with the driving voltage signals Vwlsel, Vwlunsel. The pre-decode signal Vwlsel selected by the pre-decoder 62 is then driven from the power supply voltage level Vcc to the boost voltage level Vbb at time t2, in response to the voltage-boost signal KICK.

Hence in the example of FIG. 14, after entering a state in which the pre-decode operation has ended, the driving timing signal /CDEC goes to L level on the falling edge of the address change detection signal ATD (time t1), the pre-decode signal of the X decoder control circuit 36 is supplied, and the single selected word line is driven to the power supply voltage Vcc. That is, the state in which driving of the word line is forbidden is canceled. Following this, when at time t2, the voltage-boost signal KICK rises, the selected-state word line driving voltage signal Vwlsel is boosted from the power supply voltage Vcc to the boost voltage level Vbb, and the selected word line is driven to the boost voltage level Vbb.

In this case, the boost voltage level Vbb is supplied as the power supply to the word line driver WDR249, which is an inverter; the input H level is also boosted to the boost voltage level Vbb, the P-type transistor of the CMOS inverter is reliably turned off, and the output can be set to ground potential (WLunsel) as shown in ST3-32.

In this way, at time t1, which is the timing at which the pre-decode operation corresponding to an address change ends, the X decoder 14 drives the selected word line to the power supply voltage Vcc in response to the falling edge of the driving timing signal /CDEC. Following this, at time t2 the selected word line is further driven to the boost voltage level Vbb in response to the rising edge of the voltage-boost signal KICK.

Figure 15:
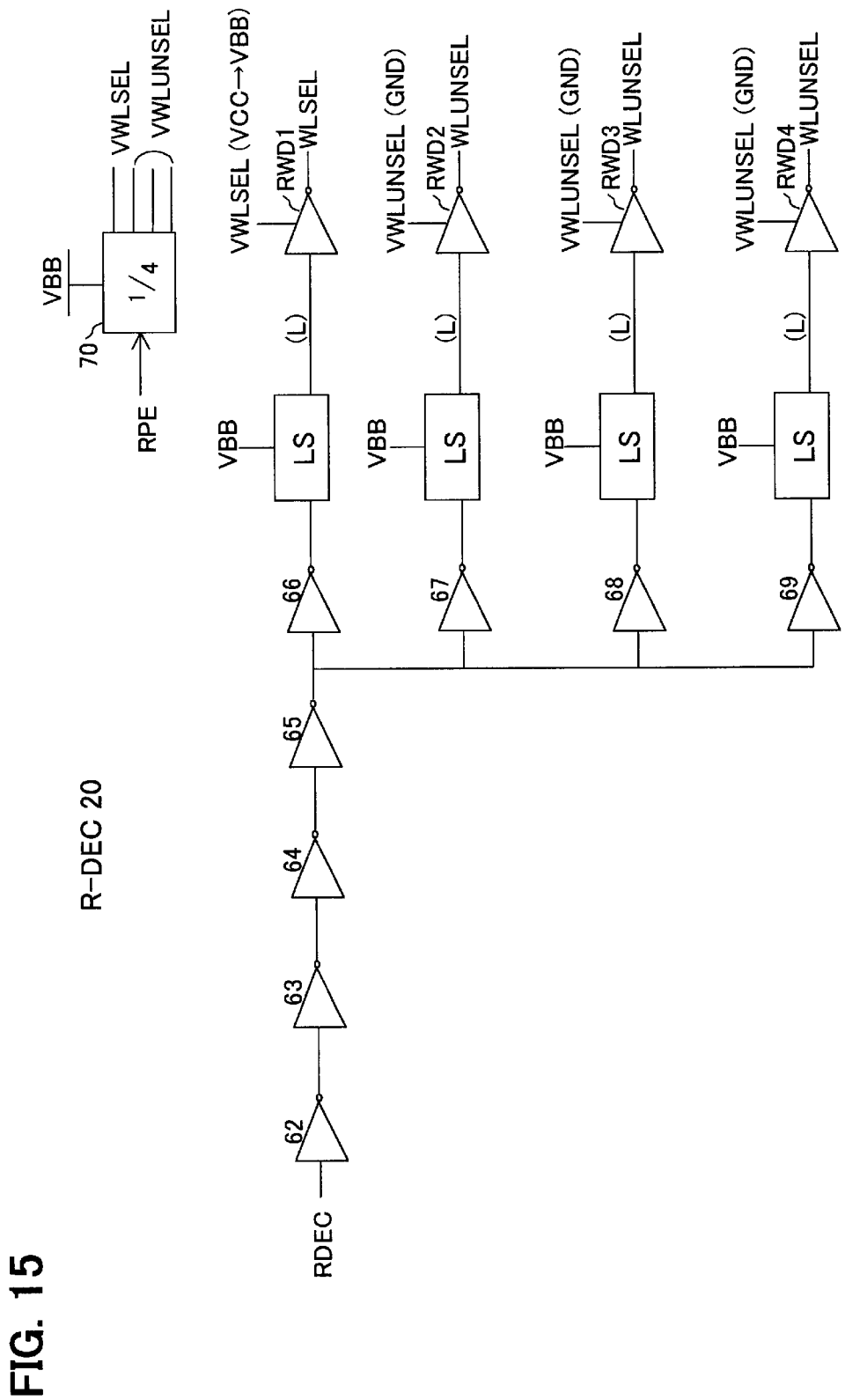
FIG. 15 is a circuit diagram of the reference-side decoder of this embodiment.

FIG. 15 is a circuit diagram of the reference-side decoder of this embodiment. This circuit has four inverter stages 62 to 65, to which the driving timing signal RDEC is supplied;

inverters 66 to 69, to which the output of the inverter 65 is input in parallel; level-shift circuits LS; and reference-side word line drivers RWD1 to RWD4, to which are input the respective outputs of the level-shift circuits LS, and which drive the word lines to the driving voltage signals Vwlsel, Vwlunsel. The driving voltage signals Vwlsel, Vwlunsel are pre-decode signals generated by the pre-decode circuit 70, which decodes read-program-erase signals RPE; normally the selected driving voltage signal Vwlsel is set to the power supply voltage Vcc and the unselected driving voltage signal Vwlunsel is set to ground level GND, and when the voltage-boost signal KICK goes to H level, the selected driving voltage signal Vwlsel is set to the boost voltage level Vbb.

Hence at the rising edge (time t1) of the driving timing signal RDEC, the reference-side decoder 20 drives the selected reference-side word line to the power supply voltage Vcc, and at the rising edge (time t2) of the voltage-boost signal KICK, drives the selected word line to the boost voltage level Vbb.

Figure 16:
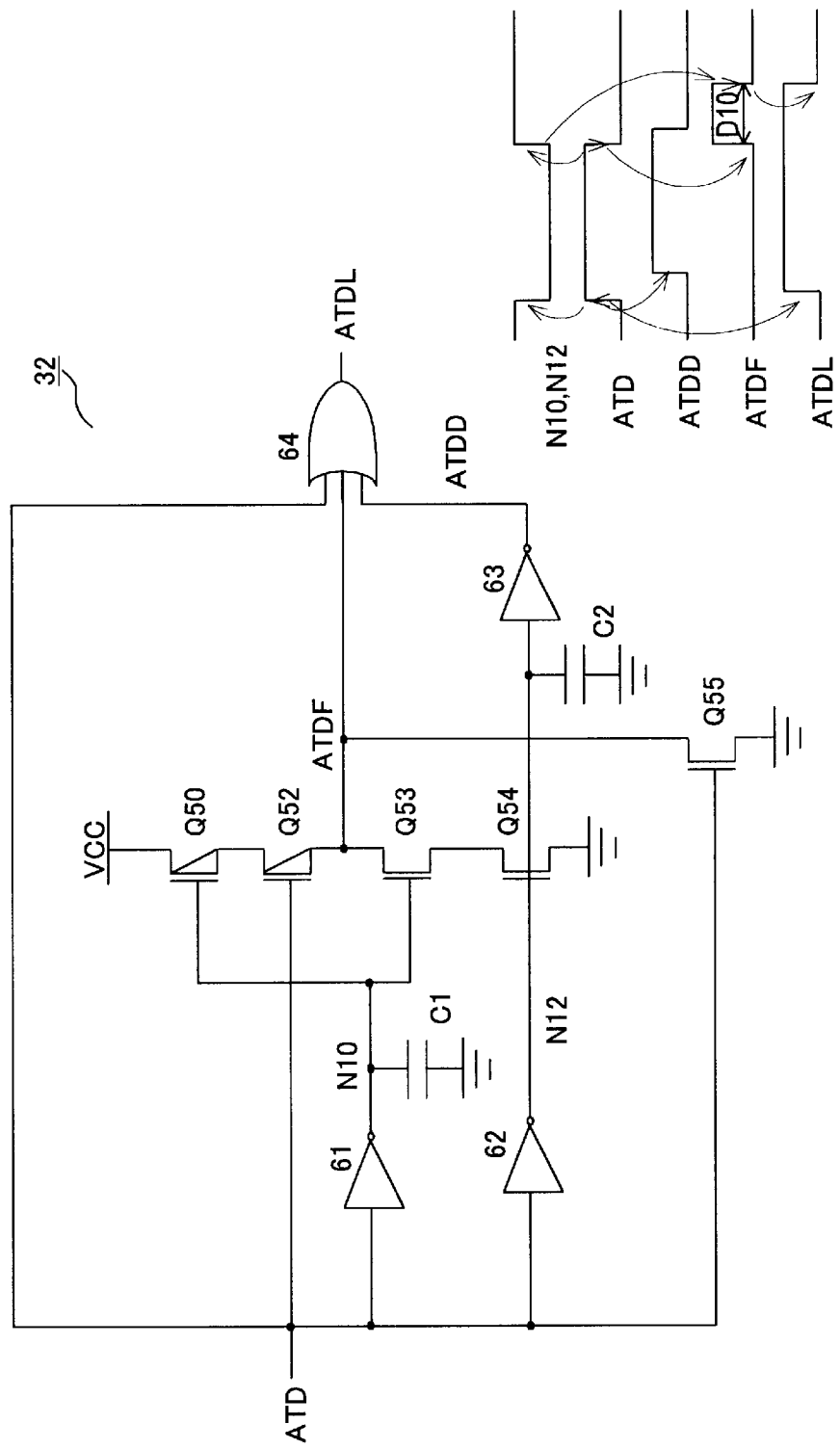
FIG. 16 is a circuit diagram of the ATDL generation circuit within the timing control circuit of this embodiment.

FIG. 16 is a circuit diagram of the ATDL generation circuit within the timing control circuit of this embodiment. This circuit inputs an address change detection signal ATD, and from this generates a second address change detection signal ATDL, the falling edge of which has a prescribed delay. Hence the address change detection signal ATD, the signal ATDF having a pulse width d10 at a prescribed time from the falling edge of the signal ATD, and the pulse signal ATDD overlapping both signals ATD and ATDF, are combined at the logical OR gate 64 to generate the second address change detection signal ATDL.

As shown in the figure, the ATDL generation circuit has inverters 61, 62, 63; transistors Q50 to Q55; capacitors C1, C2; and an OR gate 64. The address change detection signal ATD pulse is inverted by the inverters 61, 62, and an inverted pulse is generated at the nodes n10, n12 with delay characteristics according to the capacitances of the capacitors C1, C2. Hence the P-type transistors Q50, Q52 are conducting during the interval in which the signal ATD and the node n10 are both at L level, and the signal ATDF is put at H level. Consequently the signal ATDF has a prescribed pulse width d10 from the falling edge of the address change detection signal ATD.

The signal ATDD is a pulse signal generated by delaying the address change detection signal ATD by means of the inverters 62, 63; the H level interval partially overlaps with the pulses ATD and ATDF. When these pulse signals are combined at the OR gate 64, the second address change detection signal ATDL is generated.

Figure 17:
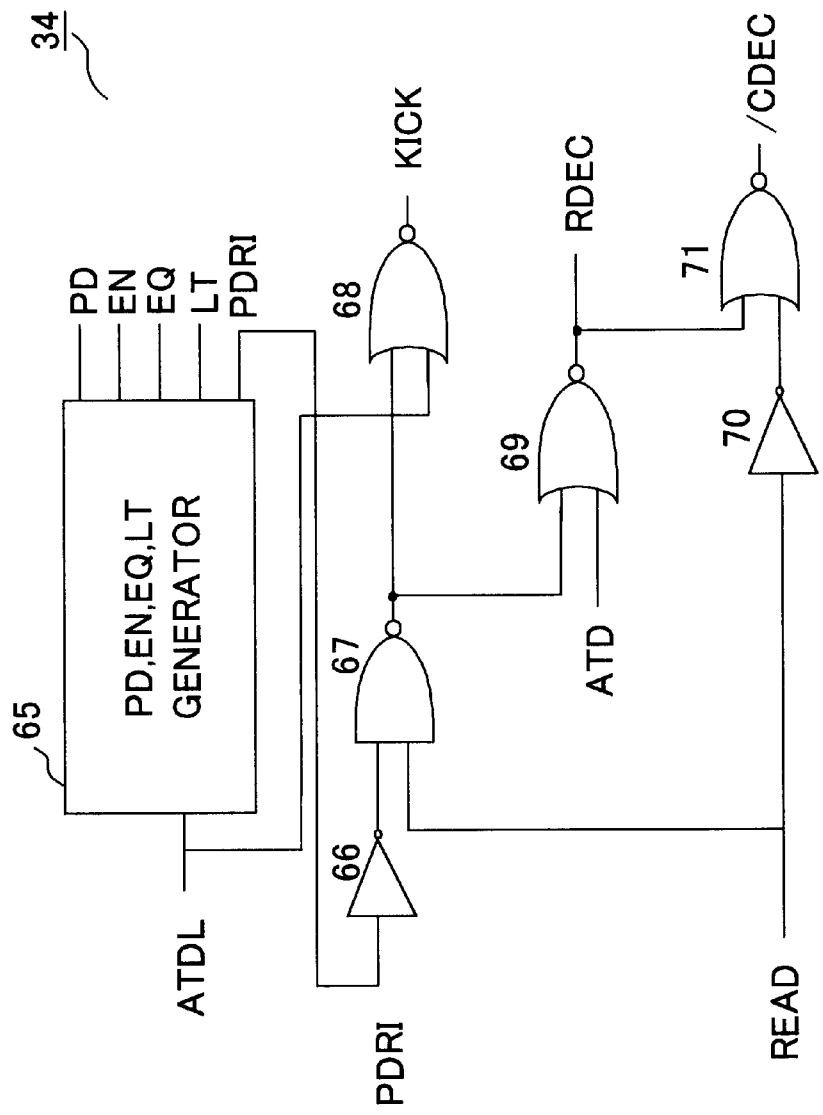
FIG. 17 is a circuit diagram of the timing signal generation circuit of this embodiment; and, FIG. 18 is the operation timing chart for FIG. 17.
Figure 18:
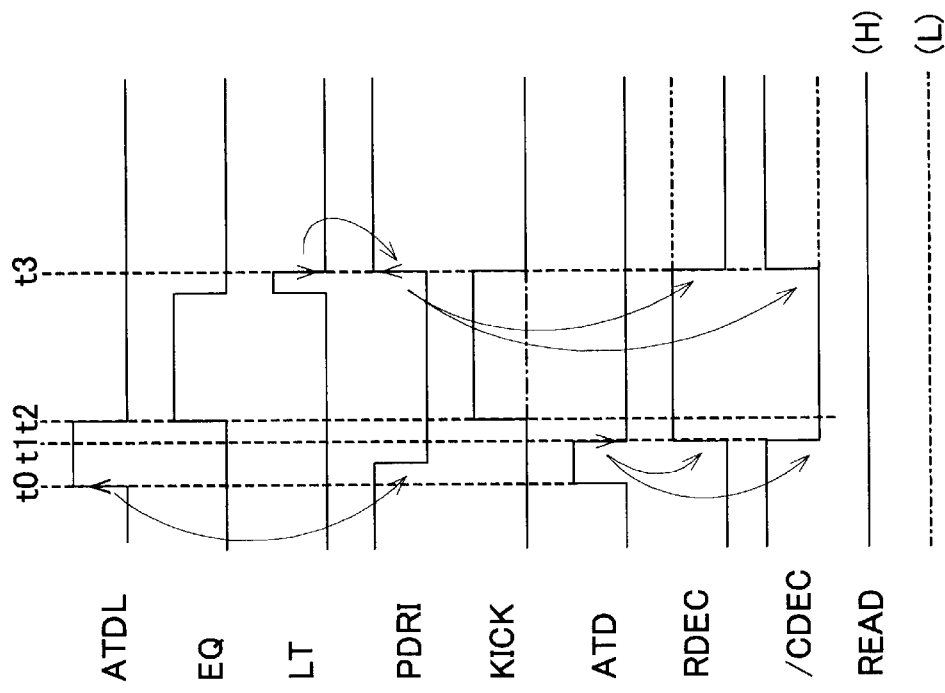

FIG. 17 is a circuit diagram of the timing signal generation circuit of this embodiment; FIG. 18 is its operation timing chart. The timing signal generation circuit 34 has a PD, EN, EQ, LT generation circuit 65, and various gates 66 to 71. Similarly to the prior art, the PD, EN, EQ, LT generation circuit 65 generates the control signals PD, EN, EQ, LT based on the falling edge of the input address change detection signal ATDL. Also, the PD, EN, EQ, LT generation circuit 65 generates a pulse signal PDRI which falls a prescribed time after the rising edge of the second address change detection signal ATDL, and rises at the falling edge of the latch signal LT.

The voltage-boost signal KICK is generated only when the read control signal READ is at H level during reading (solid lines), and is not generated when the read control signal READ is at L level while not reading (dot-dash lines). The voltage-boost signal KICK is at H level when, due to the NOR gate 68, the second address change detection signal ATDL is at L level and the pulse signal PDRI is also at L level.

The driving timing signals RDEC, /CDEC are constrained by the pulse signal PDRI while the read control signal is at H level while not reading (solid lines), but are simply inversions of the address change detection signal ATD when at L level during reading (broken lines). That is, during reading the reference-side driving timing signal RDEC is at H level while the address change detection signal ATD is at L level and the pulse signal PDRI is also at L level, due to the NOR gate 69. The core-side driving timing signal /CDEC is the inversion of the reference-side driving timing signal RDEC, due to the NOR gate 71.

Hence during reading only, the core-side and reference-side word lines are driven to the power supply voltage Vcc on the falling edge of the address change detection signal ATD, as explained above, and following this are driven to the boost voltage level Vbb on the falling edge of the second address change detection signal ATDL. At times other than reading, the voltage-boost signal KICK is not generated.

As explained above, during reading the word lines must be driven to the boost voltage level Vbb, which is higher than the power supply voltage Vcc; by decoding the address, the core-side word line is first driven to the power supply voltage Vcc to determine the selected word line, and then is raised to the boost voltage level Vbb. In this embodiment, the reference-side word line is also first driven to the power supply voltage Vcc with the timing of the core-side word line, and then driven simultaneously to the boost voltage level Vbb. Furthermore, the driving timing for both word lines is generated from the same control signal.

By this means, the driving waveforms for the two word lines are the same, and consequently the current rising edge also has the same timing. As a result, the input voltages to the sense amplifier also change with the same timing, and lowering of the operating margin of the sense amplifier is prevented.

The above-described timing control circuit is only one example, and similar results can be realized through different circuits. Further, the second address change detection signal ATDL is used to generate the driving timing circuits RDEC, /CDEC and the voltage-boost signal KICK, but these may be generated by other means.

By means of this invention, even if address skew occurs in nonvolatile semiconductor memory, the word line operation coincides, and cell currents on the cell side and on the reference side rise with the same timing. Hence the operating margin of the sense amplifier, which compares input voltages converted according to these cell currents, can be increased.

What is claimed is:

1. Nonvolatile semiconductor memory, comprising:
   a core-side cell array, having a plurality of word lines, bit lines, and memory cells;
   a reference-side cell array, having word lines, a bit line, and reference cells;
   a sense amplifier, which compares a core-side input voltage corresponding to a bit line current of said core-side cell array, and a reference-side input voltage corresponding to a bit line current of said reference-side cell array;
   an address change detection circuit, which generates an address change detection pulse during a change in input address;
   a core-side decoder-driver, which selects and drives a word line on said core side; and,
   a reference-side decoder-driver, which selects and drives a word line on said reference side; and wherein at a first time at the end of said address change detection pulse, said core-side decoder-driver and reference-side decoder driver drive said core-side word line and reference-side word line to a power supply voltage, and at a second time when a prescribed length of time elaspes after the end of said address change detection pulse, said core-side decoder-driver and reference-side decoder-driver drive said core-side word line and reference-side word line to a boost voltage level higher than the power supply voltage.

2. The nonvolatile semiconductor memory according to claim 1, wherein said sense amplifier begins comparison of said core-side input voltage and reference-side input voltage after said second time.

3. The nonvolatile semiconductor memory according to claim 1, wherein a pulse width of said address change detection pulse has a time duration from a start of the change of said input address, to an end of a pre-decode operation of the address after an end of the change of said input address.

4. The nonvolatile semiconductor memory according to claim 1, wherein internal operations comprise a read operation, a programming operation, and an erase operation, and in said read operation, said core-side decoder-driver and reference-side decoder-driver drive said core-side word line and reference-side word line to the boost voltage level higher than the power supply voltage at said second time.

5. The nonvolatile semiconductor memory according to claim 1, wherein, in read operation, said core-side decoder-driver and reference-side decoder-driver end driving to said boost voltage level at a third time, at which said sense amplifier ends sense operation.

6. The nonvolatile semiconductor memory according to claim 1, further having a core-side cascode circuit which converts a bit line current of said core-side cell array into said core-side input voltage, and a reference-side cascode circuit which converts a bit line current of said reference-side cell array into said reference-side input voltage; and wherein both said cascode circuits perform voltage conversion operations at least after said second time.

7. The nonvolatile semiconductor memory according to claim 1, wherein said core-side memory cells have a transistor having a floating gate, and an amount of charge of said floating gate differs according to stored data; and, said reference-side reference cell for reading has a transistor having a floating gate, and an amount of charge is accumulated in said floating gate of the reference cell according to the read detection level.

8. The nonvolatile semiconductor memory according to claim 1, further having a voltage-boost circuit which generates said boost voltage level for supply to said decoder-drivers, and wherein, at said second time, the voltage-boost circuit boosts the power supply voltage to said boost voltage level, and supplies said boosted voltage to said decoder-drivers.

9. Nonvolatile semiconductor memory, having:
a core-side cell array, having a plurality of word lines, bit lines, and memory cells;
a reference-side cell array, having word lines, a bit line, and reference cells;
a sense amplifier which compares a core-side input voltage corresponding to a bit line current in said core-side cell array, and a reference-side input voltage corresponding to a bit line current in said reference-side cell array;

a core-side decoder-driver, which selects and drives a word line on said core side; and,
a reference-side decoder-driver, which selects and drives a word line on said reference side; and wherein
at a first time after a change in input address, and reference-side decoder-driver said core-side decoder-driver and reference-side decoder-driver drive said core-side word line and reference-side word line to a power supply voltage, and at a second time when a prescribed length of time elaspes after said first time, said core-side decoder-driver and reference-side decoder-driver drive said core-side word line and reference-side word line to a boost voltage level higher than the power supply voltage.

10. The nonvolatile semiconductor memory according to claim 9, wherein a comparison operation of said sense amplifier is performed after said second time.

11. The nonvolatile semiconductor memory according to claim 9, further having an address change detection circuit change in the input address, and wherein said first time is controlled to have a timing of an end of said address change detection pulse.

12. Nonvolatile semiconductor memory, having:
a core-side cell array, having a plurality of word lines, bit lines and memory cells;
a reference-side cell array, having a word line, a bit line and a reference cell;
a sense amplifier, which compares a core-side input voltage corresponding to a bit line current in said core-side cell array, and a reference-side input voltage corresponding to a bit line current in said reference-side cell array;
a core-side decoder-driver which selects and drives a word line on said core-side;
a reference-side decoder-driver which selects and drives a word line on said reference-side; and,
a timing control circuit which, at a first time after a change in input address, outputs a first driving timing signal to control a driving of said core-side word line and reference-side word line, and at a second time which follows by a prescribed length of time said first time, outputs a second driving timing signal to control a driving of said core-side word line and said reference-side word line; and wherein
said core-side decoder-driver and reference-side decoder-driver drive said core-side word line and reference-side word line to the power supply voltage in response to said first driving timing signal, and drive said core-side word line and reference-side word line to a boost voltage level, higher than said power supply voltage, in response to said second driving timing signal.

13. The nonvolatile semiconductor memory according to claim 12, further having a first address change detection circuit, which generates a first address change detection signal during a change in the input address, and a second address change detection circuit, which generates, in response to activation of said first address change detection signal, a second address change detection signal having a pulse width longer by a prescribed length of time than said first address change detection signal; and wherein said first driving timing signal is generated in response to said first address change detection signal, and said second driving timing signal is generated in response to said second address change detection signal.

* * * * *